(12) United States Patent
Shiah et al.

(10) Patent No.: US 8,872,540 B2
(45) Date of Patent: Oct. 28, 2014

(54) METHOD OF SHARING IN USE AN IMPEDANCE MATCHING CIRCUIT OF A MEMORY CIRCUIT TO PERFORM AN INITIAL CALIBRATION AND A FULL TIME REFRESH MODE CALIBRATION, AND MEMORY CIRCUIT WITH AN IMPEDANCE MATCHING CIRCUIT CAPABLE OF BEING USED IN AN INITIAL CALIBRATION AND A FULL TIME REFRESH MODE CALIBRATION

(75) Inventors: Chun Shiah, Hsinchu (TW); Sen-Fu Hong, Tainan (TW); Wen-Wey Chen, Changhua County (TW)

(73) Assignee: Etron Technology, Inc., Hsinchu (TW)

( * ) Notice: Subject to any disclaimer, the term of this patent is extended or adjusted under 35 U.S.C. 154(b) by 0 days.

(21) Appl. No.: 13/547,015

(22) Filed: Jul. 11, 2012

(65) Prior Publication Data
US 2013/0293260 A1 Nov. 7, 2013

(30) Foreign Application Priority Data

May 7, 2012 (TW) ............................. 101116167 A

(51) Int. Cl.
H03K 19/003 (2006.01)
G11C 11/406 (2006.01)
H03K 19/00 (2006.01)

(52) U.S. Cl.
CPC .......... H03K 19/0005 (2013.01); G11C 11/406 (2013.01)
USPC ................................ 326/30; 326/87; 327/112

(58) Field of Classification Search
None
See application file for complete search history.

(56) References Cited

U.S. PATENT DOCUMENTS

| | | | | |
|---|---|---|---|---|
| 6,380,758 B1 * | 4/2002 | Hsu et al. | ......................... | 326/30 |
| 6,452,428 B1 * | 9/2002 | Mooney et al. | ............... | 327/108 |
| 6,842,035 B2 * | 1/2005 | Kurts et al. | ...................... | 326/30 |
| 6,894,946 B2 * | 5/2005 | Jang | ........................... | 365/233.1 |
| 7,227,376 B2 * | 6/2007 | Ahmad et al. | ................... | 326/30 |
| 7,554,354 B2 * | 6/2009 | Kim | ................. | 326/30 |
| 7,710,144 B2 * | 5/2010 | Dreps et al. | ..................... | 326/30 |
| 7,710,169 B2 * | 5/2010 | Tanaka | .......................... | 327/112 |
| 7,821,292 B2 * | 10/2010 | Yang et al. | ....................... | 326/30 |
| 7,839,159 B2 * | 11/2010 | Nakamura et al. | ........ | 324/755.07 |
| 8,581,649 B2 * | 11/2013 | Nishio | .......................... | 327/170 |

OTHER PUBLICATIONS

JEDEC Standard, Double Data Rate (DDR) SDRAM Specification, Mar. 2003.*
HYNIX SDRAM Device Operation, Sep. 2003.*

* cited by examiner

*Primary Examiner* — Alexander H Taningco
*Assistant Examiner* — Nelson Correa
(74) *Attorney, Agent, or Firm* — Winston Hsu; Scott Margo

(57) ABSTRACT

A method of sharing in use an impedance matching circuit of a memory circuit to perform an initial calibration and a full time refresh mode calibration includes supplying power to the memory circuit, utilizing the impedance matching circuit to perform the initial calibration on the memory circuit, the memory circuit exiting the initial calibration, the memory circuit entering a driving mode, the memory circuit exiting the driving mode every a predetermined interval, utilizing the impedance matching circuit to perform the full time refresh mode calibration on the memory circuit according to a refresh command, an output voltage detection circuit determining a level of an output voltage of the memory circuit, and performing a corresponding operation according to a determination result generated by the output voltage detection circuit.

9 Claims, 3 Drawing Sheets

METHOD OF SHARING IN USE AN IMPEDANCE MATCHING CIRCUIT OF A MEMORY CIRCUIT TO PERFORM AN INITIAL CALIBRATION AND A FULL TIME REFRESH MODE CALIBRATION, AND MEMORY CIRCUIT WITH AN IMPEDANCE MATCHING CIRCUIT CAPABLE OF BEING USED IN AN INITIAL CALIBRATION AND A FULL TIME REFRESH MODE CALIBRATION

BACKGROUND OF THE INVENTION

1. Field of the Invention

The present invention relates to a method and a memory circuit that can perform an initial calibration and a full time refresh mode calibration in the memory circuit, and particularly to a method and a memory circuit that can share in use an impedance matching circuit of the memory circuit to perform an initial calibration and a full time refresh mode calibration.

2. Description of the Prior Art

Communication between two chips not only needs an accurate timing, but also needs accurate impedance matching between the two chips. An extended mode register set (EMRS) mode can be utilized to perform an off chip driver impedance matching calibration to accurately design the impedance matching between the two chips according to a standard of the Joint Electron Device Engineering Council (JEDEC).

Please refer to FIG. 1. FIG. 1 is a diagram illustrating a memory circuit 100 according to the prior art. After power is supplied to the memory circuit 100, the memory circuit 100 first enters the extended mode register set mode. In the extended mode register set mode, a user needs to utilize an oscilloscope to artificially determine slew rates of a logic-high voltage "1" and a logic-low voltage "0" of an output voltage of the memory circuit 100. Then, the user utilizes a pull-up driver 1022 and a pull-down driver 1024 of an impedance matching circuit 102 to adjust the slew rates of the logic-high voltage "1" and the logic-low voltage "0" of the output voltage of the memory circuit 100. In addition, as shown in FIG. 1, the memory circuit 100 further includes a calibration circuit 104 for adjusting strength of the slew rates.

However, as shown in FIG. 1, because the memory circuit 100 utilizes the impedance matching circuit 102 and the calibration circuit 104 to perform the extended mode register set mode and the full time refresh mode calibration, respectively, the memory circuit 100 has a larger area and the memory circuit 100 can not perform the refresh mode calibration full time.

SUMMARY OF THE INVENTION

An embodiment provides a method of sharing in use an impedance matching circuit of a memory circuit to perform an initial calibration and a full time refresh mode calibration. The method includes supplying power to the memory circuit; utilizing the impedance matching circuit to perform the initial calibration on the memory circuit; the memory circuit exiting the initial calibration; the memory circuit entering a driving mode; the memory circuit exiting the driving mode every a predetermined interval; utilizing the impedance matching circuit to perform the full time refresh mode calibration on the memory circuit according to a refresh command; an output voltage detection circuit determining a level of an output voltage of the memory circuit; and performing a corresponding operation according to a determination result generated by the output voltage detection circuit.

Another embodiment provides a memory circuit with an impedance matching circuit capable of being used in an initial calibration and a full time refresh mode calibration. The memory circuit includes an output voltage detection circuit and an impedance matching circuit. The output voltage detection circuit is used for determining a level of an output voltage of the memory circuit. The impedance matching circuit includes a pull-up driver and a pull-down driver. The pull-up driver is used for pulling up the level of the output voltage when the level of the output voltage is lower than a low reference voltage in the initial calibration and the full time refresh mode calibration of the memory circuit. The pull-down driver is used for pulling down the level of the output voltage when the level of the output voltage is higher than a high reference voltage in the initial calibration and the full time refresh mode calibration of the memory circuit.

The present invention provides a method of sharing in use an impedance matching circuit of a memory circuit to perform an initial calibration and a full time refresh mode calibration and a memory circuit with an impedance matching circuit capable of being used in an initial calibration and a full time refresh mode calibration. The method and the memory circuit can let a user utilize the impedance matching circuit of the memory circuit to perform the initial calibration after power is supplied to the memory circuit. That is to say, the memory circuit enters an extended mode register set (EMRS) mode. During performing the initial calibration, the user can adjust slew rates of a logic-high voltage and a logic-low voltage of an output voltage of the memory circuit by the impedance matching circuit. After the initial calibration is completed and the memory circuit exits the initial calibration, the memory circuit enters a driving mode. In the driving mode, the memory circuit exits the driving mode every a predetermined interval to perform the full time refresh mode calibration. During performing the full time refresh mode calibration, the memory circuit utilizes an output voltage detection circuit to determine a level of the output voltage of the memory circuit, and adjusts the level of the output voltage of the memory circuit by the impedance matching circuit. Thus, the present invention can utilize the impedance matching circuit of the memory circuit to combine the initial calibration with the full time refresh mode calibration. Therefore, not only the present invention can perform full time impedance matching to reduce reflection of the output voltage of the memory circuit, but can also reduce an area of the memory circuit because of the initial calibration and the full time refresh mode calibration sharing in use the impedance matching circuit.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
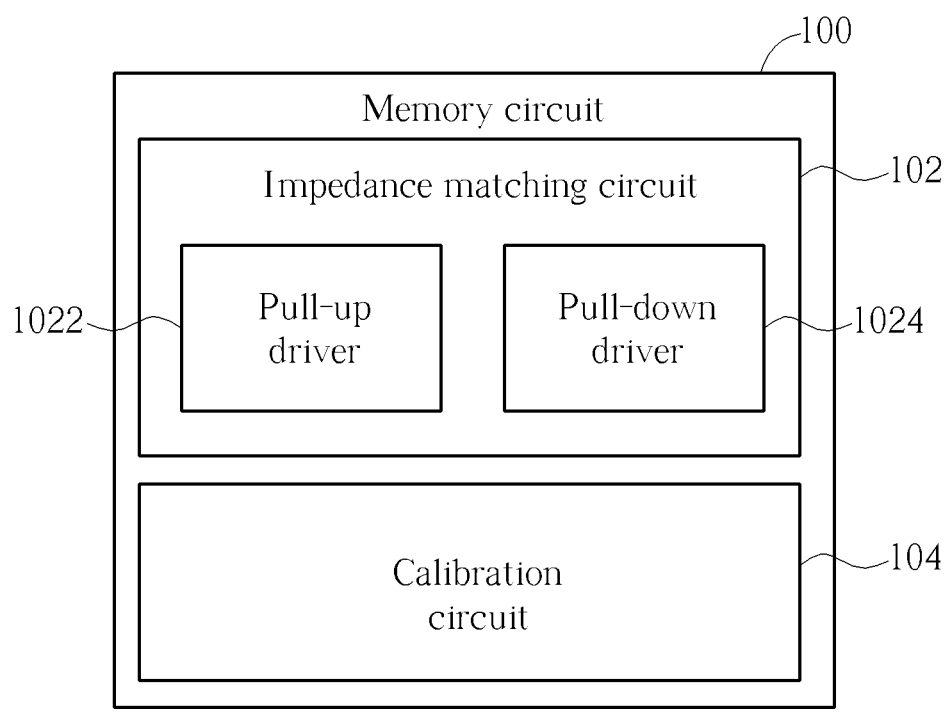
FIG. 1 is a diagram illustrating a memory circuit according to the prior art.
Figure 2:
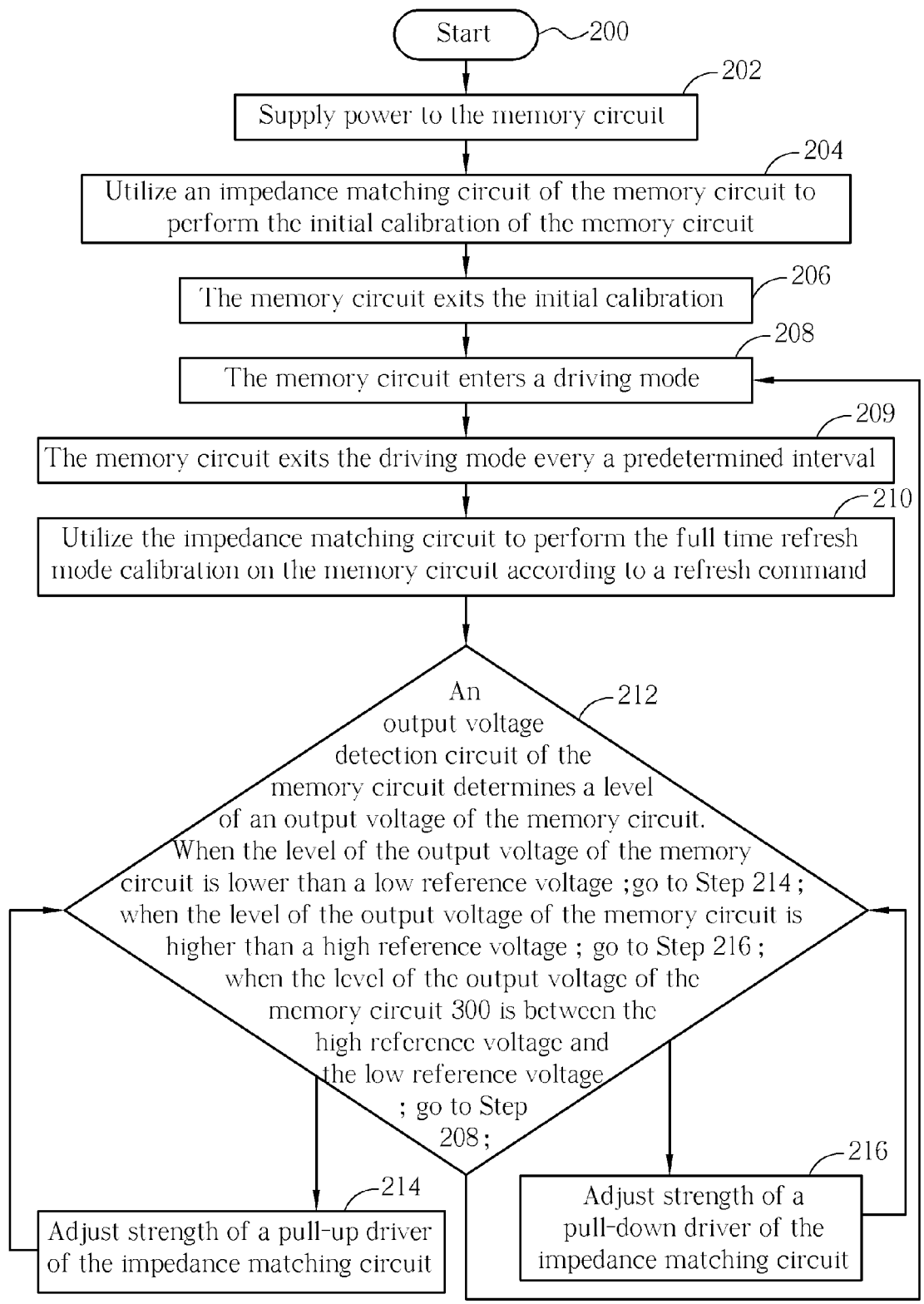
FIG. 2 is a flowchart illustrating a method of sharing in use an impedance matching circuit of a memory circuit to perform an initial calibration and a full time refresh mode calibration according to an embodiment.
Figure 3:
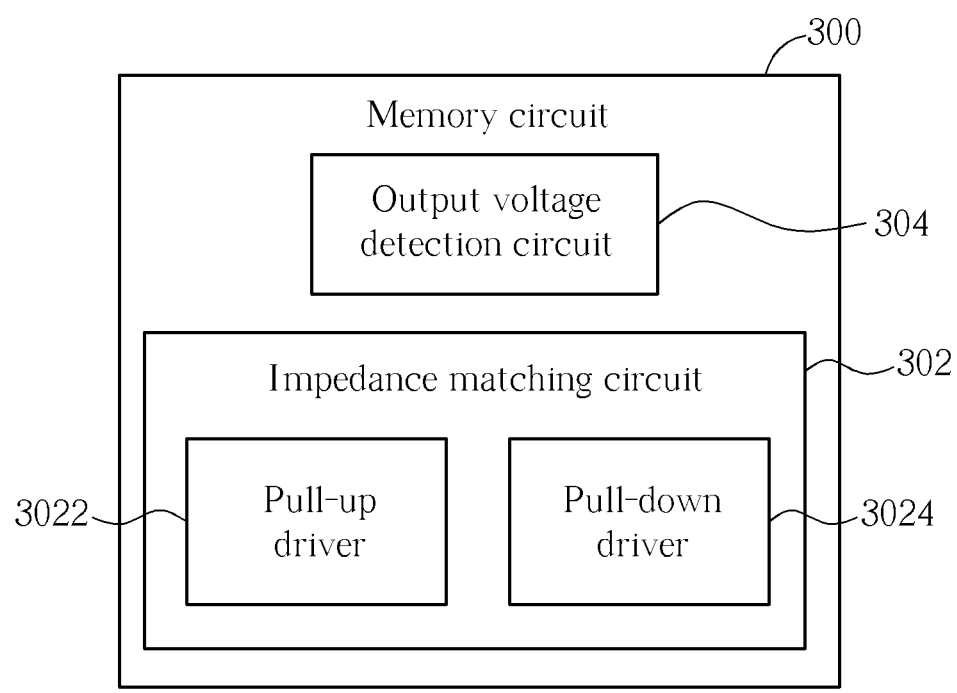
FIG. 3 is a diagram illustrating a memory circuit.

Please refer to FIG. 2 and FIG. 3. FIG. 2 is a flowchart illustrating a method of sharing in use an impedance matching circuit of a memory circuit to perform an initial calibration and a full time refresh mode calibration according to an embodiment, and FIG. 3 is a diagram illustrating a memory circuit 300. The method in FIG. 2 is illustrated using the memory circuit 300 in FIG. 3. Detailed steps are as follows:

Step 200: Start.

Step 202: Supply power to the memory circuit 300.

Step 204: Utilize an impedance matching circuit 302 of the memory circuit 300 to perform the initial calibration of the memory circuit 300.

Step 206: The memory circuit 300 exits the initial calibration.

Step 208: The memory circuit 300 enters a driving mode.

Step 209: The memory circuit 300 exits the driving mode every a predetermined interval.

Step 210: Utilize the impedance matching circuit 302 to perform the full time refresh mode calibration on the memory circuit 300 according to a refresh command.

Step 212: An output voltage detection circuit 304 of the memory circuit 300 determines a level of an output voltage Vo of the memory circuit 300. When the level of the output voltage Vo of the memory circuit 300 is lower than a low reference voltage VREFL; go to Step 214; when the level of the output voltage Vo of the memory circuit 300 is higher than a high reference voltage VREFH; go to Step 216; when the level of the output voltage Vo of the memory circuit 300 is between the high reference voltage VREFH and the low reference voltage VREFL; go to Step 208.

Step 214: Adjust strength of a pull-up driver 3022 of the impedance matching circuit 302; go to Step 212.

Step 216: Adjust strength of a pull-down driver 3024 of the impedance matching circuit 302; go to Step 212.

In order to make good impedance matching exist between the memory circuit 300 and a next stage circuit (e.g. a controller), the impedance matching circuit 302 of the memory circuit 300 can be utilized to perform an off chip driver impedance matching calibration according to a standard of the Joint Electron Device Engineering Council (JEDEC) to design the impedance matching exist between the memory circuit 300 and the next stage circuit.

Therefore, after the power is supplied to the memory circuit 300, in Step 204, a user can utilize an oscilloscope to artificially perform the initial calibration on the memory circuit 300 through the impedance matching circuit 302 of the memory circuit 300. That is to say, the memory circuit 300 enters an extended mode register set (EMRS) mode. In the extended mode register set mode, the user needs to utilize the oscilloscope to artificially determine slew rates of a logic-high voltage "1" and a logic-low voltage "0" of the output voltage Vo of the memory circuit 300. Then, the pull-up driver 3022 and the pull-down driver 3024 of the impedance matching circuit 302 are utilized to adjust the slew rates of the logic-high voltage "1" and the logic-low voltage "0" of the output voltage Vo of the memory circuit 300, respectively. In Step 206, because the user completely performs the initial calibration on the memory circuit 300, the memory circuit 300 exits the initial calibration.

After the memory circuit 300 exits the initial calibration, in Step 208, the memory circuit 300 enters the driving mode, where the driving mode includes the memory circuit 300 receiving and executing an active command, a read command, a write command, and/or an idle command. But, the present invention is not limited to the memory circuit 300 being only used for receiving and executing the active command, the read command, the write command, and/or the idle command.

In Step 209, the memory circuit 300 can exit the driving mode every the predetermined interval. In Step 210, after the memory circuit 300 exits the driving mode, the memory circuit 300 can utilize the impedance matching circuit 302 to perform the full time refresh mode calibration on the memory circuit 300 according to the refresh command. In Step 212, the output voltage detection circuit 304 determines the level of the output voltage Vo of the memory circuit 300. In Step 214, because the level of the output voltage Vo of the memory circuit 300 is lower than the low reference voltage VREFL, the strength of the pull-up driver 3022 of impedance matching circuit 302 is adjusted; go to Step 212. In Step 216, because the level of the output voltage Vo of the memory circuit 300 is higher than the high reference voltage VREFH, the strength of the pull-down driver 3024 of impedance matching circuit 302 is adjusted; go to Step 212. However, when the level of the output voltage Vo of the memory circuit 300 is between the high reference voltage VREFH and the low reference voltage VREFL; go to Step 208.

To sum up, the method of sharing in use the impedance matching circuit of the memory circuit to perform the initial calibration and the full time refresh mode calibration and the memory circuit with the impedance matching circuit capable of being used in the initial calibration and the full time refresh mode calibration can let the user utilize the impedance matching circuit of the memory circuit to perform the initial calibration after power is supplied to the memory circuit. That is to say, the memory circuit enters the extended mode register set mode. During performing the initial calibration, the user can adjust the slew rates of the logic-high voltage and the logic-low voltage of the output voltage of the memory circuit by the impedance matching circuit. After the initial calibration is completed and the memory circuit exits the initial calibration, the memory circuit enters the driving mode. In the driving mode, the memory circuit exits the driving mode every the predetermined interval to perform the full time refresh mode calibration. During performing the full time refresh mode calibration, the memory circuit utilizes the output voltage detection circuit to determine the level of the output voltage of the memory circuit, and adjusts the level of the output voltage of the memory circuit by the impedance matching circuit. Thus, the present invention can utilize the impedance matching circuit of the memory circuit to combine the initial calibration with the full time refresh mode calibration. Therefore, not only the present invention can perform the full time impedance matching to reduce reflection of the output voltage of the memory circuit, but can also reduce an area of the memory circuit because of the initial calibration and the full time refresh mode calibration sharing in use the impedance matching circuit.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of sharing in use an impedance matching circuit of a memory circuit to perform an initial calibration and a full time refresh mode calibration, wherein the impedance matching circuit comprises a pull-up driver and a pull-down driver, the method comprising:

supplying power to the memory circuit;

utilizing the pull-up driver and the pull-down driver of the impedance matching circuit to perform the initial calibration on the memory circuit to adjust slew rates of a logic-high voltage and a logic-low voltage of an output voltage of the memory circuit;

the memory circuit exiting the initial calibration;
the memory circuit entering a driving mode;
the memory circuit exiting the driving mode every a predetermined interval;
utilizing the pull-up driver and the pull-down driver of the impedance matching circuit to perform the full time refresh mode calibration on the memory circuit according to a refresh command after exiting the driving mode, wherein a self-refresh period does not exist between the full time refresh mode and the driving mode;
an output voltage detection circuit of the memory circuit determining a level of the output voltage of the memory circuit; and
utilizing the pull-up driver and the pull-down driver of the impedance matching circuit to adjust the level of the output voltage according to a determination result generated by the output voltage detection circuit, a low reference voltage, and a high reference voltage, wherein the low reference voltage is different from the high reference voltage, and the pull-up driver and the pull-down driver are coupled to an output terminal of the memory circuit.

2. The method of claim 1, wherein adjusting the level of the output voltage according to the determination result generated by the output voltage detection circuit, the low reference voltage, and the high reference voltage comprises:
adjusting strength of the pull-up driver of the impedance matching circuit when the level of the output voltage of the memory circuit is lower than the low reference voltage.

3. The method of claim 1, wherein adjusting the level of the output voltage according to the determination result generated by the output voltage detection circuit, the low reference voltage, and the high reference voltage comprises:
adjusting strength of the pull-down driver of the impedance matching circuit when the level of the output voltage of the memory circuit is higher than the high reference voltage.

4. The method of claim 1, wherein adjusting the level of the output voltage according to the determination result generated by the output voltage detection circuit, the low reference voltage, and the high reference voltage comprises:
the memory circuit returning to the driving mode when the level of the output voltage of the memory circuit is between the high reference voltage and the low reference voltage.

5. The method of claim 1, wherein the memory circuit receives an active command, a read command, a write command, and/or an idle command in the driving mode.

6. The method of claim 1, wherein the initial calibration comprises an extended mode register set (EMRS) mode.

7. A memory circuit with an impedance matching circuit capable of being used in an initial calibration and a full time refresh mode calibration, the memory circuit comprising:
an output voltage detection circuit for determining a level of an output voltage of the memory circuit; and
an impedance matching circuit comprising:
a pull-up driver for pulling up the level of the output voltage when the level of the output voltage is lower than a low reference voltage in the full time refresh mode calibration of the memory circuit; and
a pull-down driver for pulling down the level of the output voltage when the level of the output voltage is higher than a high reference voltage in the full time refresh mode calibration of the memory circuit;
wherein the pull-up driver and the pull-down driver are further used to perform the initial calibration on the memory circuit to adjust slew rates of a logic-high voltage and a logic-low voltage of the output voltage of the memory circuit;
wherein the low reference voltage is different from the high reference voltage, a self-refresh period does not exist between the full time refresh mode and the driving mode, and the pull-up driver and the pull-down driver are coupled to an output terminal of the memory circuit.

8. The memory circuit of claim 7, wherein the output voltage detection circuit determines the level of the output voltage of the memory circuit in the full time refresh mode calibration of the memory circuit.

9. The memory circuit of claim 7, wherein the initial calibration comprises an extended mode register set mode.

* * * * *